(12) United States Patent
Kim (10) Patent No.: US 12,146,804 B2
(45) Date of Patent: Nov. 19, 2024

(54) WHEEL NUT LOOSENING DETECTION DEVICE AND METHOD OF CONTROLLING THE SAME

(71) Applicants: HYUNDAI MOTOR COMPANY, Seoul (KR); KIA CORPORATION, Seoul (KR)

(72) Inventor: Keunjin Kim, Seongnam-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 232 days.

(21) Appl. No.: 17/899,301

(22) Filed: Aug. 30, 2022

(65) Prior Publication Data

US 2023/0152173 A1 May 18, 2023

(30) Foreign Application Priority Data

Nov. 17, 2021 (KR) ........................ 10-2021-0158633

(51) Int. Cl.
*G01L 5/24* (2006.01)
*B60B 23/06* (2006.01)
*G01R 19/00* (2006.01)

(52) U.S. Cl.
CPC ................ *G01L 5/24* (2013.01); *B60B 23/06* (2013.01); *G01R 19/0092* (2013.01)

(58) Field of Classification Search
CPC ............ G01L 5/24; G01L 5/169; B60B 23/06
See application file for complete search history.

(56) References Cited

U.S. PATENT DOCUMENTS

| 7,994,901 | B2 * | 8/2011 | Malis | ........................ B60B 3/16 |
| | | | | 340/426.33 |
| 9,978,190 | B2 * | 5/2018 | Lopes | ........................ G01L 5/24 |
| 2017/0138387 | A1 * | 5/2017 | Saigo | ........................ G01L 5/24 |
| 2021/0039588 | A1 * | 2/2021 | Davis | ........................ B60B 7/16 |

FOREIGN PATENT DOCUMENTS

KR 101481298 B1 1/2015

* cited by examiner

*Primary Examiner* — Erika J. Villaluna
(74) *Attorney, Agent, or Firm* — Lempia Summerfield Katz LLC (57) ABSTRACT

A wheel nut loosening detection device including: a wheel having a wheel nut fastening unit; a hub; a wheel bolt configured to penetrate the wheel and the hub; a wheel nut fastened to the wheel bolt and configured to fix the wheel and the hub; at least one magnet mounted on the wheel nut; and a closed circuit mounted in the wheel nut fastening unit and disposed adjacent to the at least one magnet. The wheel nut loosening detection device further includes a current detector configured to output a corresponding output signal in response to a change in current in the closed circuit, and an output unit configured to output a warning signal in response to the output signal of the current detector.

11 Claims, 7 Drawing Sheets

WHEEL NUT LOOSENING DETECTION DEVICE AND METHOD OF CONTROLLING THE SAME

CROSS-REFERENCE TO RELATED APPLICATION

This application claims priority to and the benefit of Korean Patent Application No. 10-2021-0158633 filed in the Korean Intellectual Property Office on Nov. 17, 2021, the entire contents of which are incorporated herein by reference.

BACKGROUND

(a) Field of the Disclosure

The present disclosure relates to a wheel nut loosening detection device and a method of controlling the same, which are capable of warning a driver of a loosened state of a wheel nut used to fix a wheel and a hub of a vehicle.

(b) Description of the Related Art

In general, a wheel fixing device includes a hub and a drum installed on an axle configured to receive power of an engine, and the hub and the drum rotate together with the axle. In addition, a wheel is coupled by wheel bolts provided on the hub. Wheel nuts are fastened to the wheel bolts fitted with the wheel, such that the wheel is fixed to the hub. Therefore, the wheel and the axle may be integrally rotated.

When the wheel nut for fixing the wheel (i.e., a driving wheel) is loosened while a vehicle having the above-mentioned structure travels, the wheel may be separated from the vehicle, which may cause a large-scale accident. Therefore, a fastening force of the wheel nut is considered important in the corresponding technical field. For this reason, it is necessary to always inspect a fastened state of the wheel nut before and after the vehicle travels. However, it is difficult to recognize the amount of loosening of the wheel nut with the naked eye. Therefore, it is necessary to measure a fastening torque using a separate tool or to tighten the wheel nut at normal times to prevent the wheel nut from being loosened.

Therefore, studies have been conducted on a wheel nut loosening detection device capable of checking whether the wheel nut is loosened without using a separate tool or other facilities, where the wheel nut loosening detection device is configured to transmit a warning signal when the wheel nut is loosened.

For example, a variable resistor may be used to detect a rotation of the wheel nut based on a change in resistance value. However, there is a problem in that a battery needs to be used to supply power.

In addition, where the variable resistor consistently operates, a battery provided in the vehicle cannot cope with the electric power consumption. For this reason, the wheel nut loosening detection device needs to operate only at a particular point in time (e.g., only after the traveling of the vehicle is completed). Accordingly, there is a problem in that it is impossible to detect the loosened state of the wheel nut in real-time while the vehicle travels.

The above information disclosed in this Background section is only to enhance understanding of the background of the disclosure. Therefore, the Background section may contain information that does not form the prior art that is already known in this country to a person of ordinary skill in the art.

SUMMARY

The present disclosure has been made in an effort to provide a wheel nut loosening detection device and a method of controlling the same, which may adopt an electromagnetic induction principle, detect induced current generated in a closed circuit by a change in a magnetic field when a wheel nut including a magnet is loosened, and warn a driver of the loosened state of the wheel nut.

An embodiment of the present disclosure provides a wheel nut loosening detection device including: a wheel having a wheel nut fastening unit; a hub; a wheel bolt configured to penetrate the wheel and the hub; a wheel nut fastened to the wheel bolt and configured to fix the wheel and the hub; at least one magnet mounted on the wheel nut; a closed circuit mounted in the wheel nut fastening unit and disposed adjacent to the at least one magnet; a current detector configured to output a corresponding output signal in response to a change in current in the closed circuit; and an output unit configured to output a warning signal in response to the output signal of the current detector.

The at least one magnet may include a plurality of magnets, and the plurality of magnets may be disposed at predetermined intervals along a periphery of the wheel nut.

According to an embodiment of the present disclosure, the wheel nut loosening detection device may include a memory configured to store an output value and a number of outputs in response to the output signal of the current detector.

As mentioned above, the closed circuit may be mounted in the wheel nut fastening unit.

The current detector and the output unit may communicate with each other in a wireless manner.

The current detector may output a value related to a generation of an induced current in response to the induced current being induced by a rotation of the wheel nut.

The output unit may output a warning signal when a measured output value of the induced current exceeds a preset reference value.

The output unit may output a warning signal when the measured number of outputs of the induced current exceeds a preset number of outputs.

Another embodiment of the present disclosure provides a method of controlling the wheel nut loosening detection device. The method includes detecting, by the current detector, an induced current in the closed circuit and comparing, by the output unit, an output value outputted by the current detector with a preset reference value of the induced current when the current detector detects the induced current. The method further includes outputting, by the output unit, a warning signal when the output value exceeds the preset reference value of the induced current.

The wheel nut loosening detection device, according to an embodiment of the present disclosure, may further include a memory configured to store an output value and the number of outputs in response to the output signal of the current detector. The method of controlling the wheel nut loosening detection device, according to an embodiment of the present disclosure, may further include storing an outputted signal in the memory when the current detector outputs the output signal.

The method of controlling the wheel nut loosening detection device, according to an embodiment of the present disclosure, may further include comparing, by the output unit, the measured number of outputs of the induced current with a preset number of outputs. The method of controlling the wheel nut loosening detection device may further include outputting, by the output unit, a warning signal when the measured number of outputs of the induced current exceeds the preset number of outputs.

According to the present disclosure, a driver may recognize the generation of the induced current and predict a loosened state of the wheel nut. The driver may recognize the loosened state of the wheel nut even while the vehicle travels. Therefore, it is possible to prevent a safety accident that may occur because of the loosened state of the wheel nut.

In addition, the wheel nut loosening detection device may detect the loosened state of the wheel nut without using a separate battery. Therefore, it is possible to detect the loosened state of the wheel nut without using the electric power of the battery of the vehicle.

Other effects, which may be obtained or expected by the embodiments of the present disclosure, are directly or implicitly disclosed in the detailed description of the embodiments of the present disclosure. In other words, various effects expected according to the embodiments of the present disclosure are disclosed in the detailed description described below.

DETAILED DESCRIPTION OF THE EMBODIMENTS

Hereinafter, embodiments of the present disclosure are described in detail with reference to the accompanying drawings so that those with ordinary skill in the art to which the present disclosure pertains may easily carry out the embodiments. However, the present disclosure may be implemented in various different ways and is not limited to the embodiments described herein.

A part irrelevant to the description is omitted to clearly describe the present disclosure, and the same or similar constituent elements are designated by the same reference numerals throughout the specification.

In the following description, names of constituent elements are classified as a first . . . , a second . . . , and the like so as to discriminate the constituent elements having the same name, and the names are not essentially limited to the order in the description below.

When a component, device, element, or the like of the present disclosure is described as having a purpose or performing an operation, function, or the like, the component, device, or element should be considered herein as being "configured to" meet that purpose or to perform that operation or function.

In general, a bolt and a nut are installed to connect and fix an object. When the nut is loosened, it may cause the occurrence of an accident and may cause damage to devices. Therefore, the fastened state between the bolt and the nut must always be checked for safety.

The present disclosure is described below, focusing on a means for detecting a loosened state of the bolt and the nut used to connect a wheel and a hub in a wheel structure of a vehicle. The present disclosure may be applied not only to the wheel structure of the vehicle, but also to all devices using the bolt and the nut.

Figure 1:
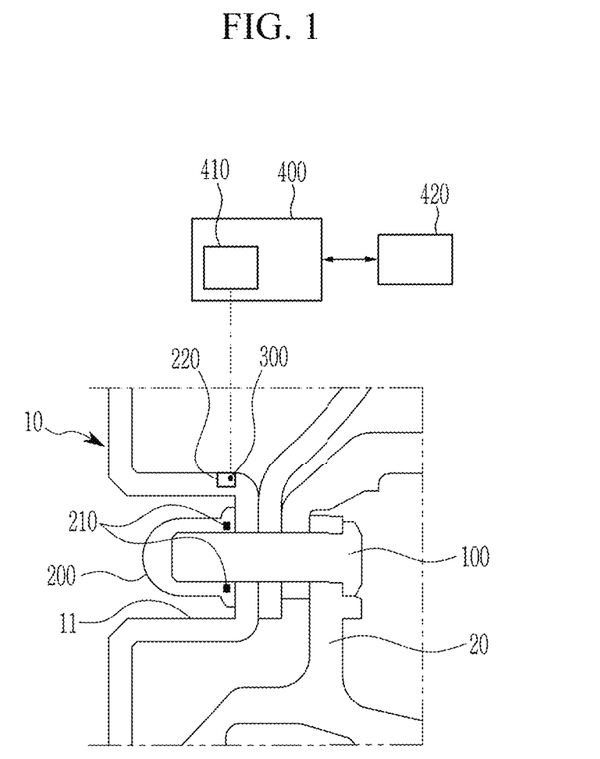
FIG. 1 is a view illustrating a wheel nut loosening detection device according to an embodiment of the present disclosure.
Figure 2:
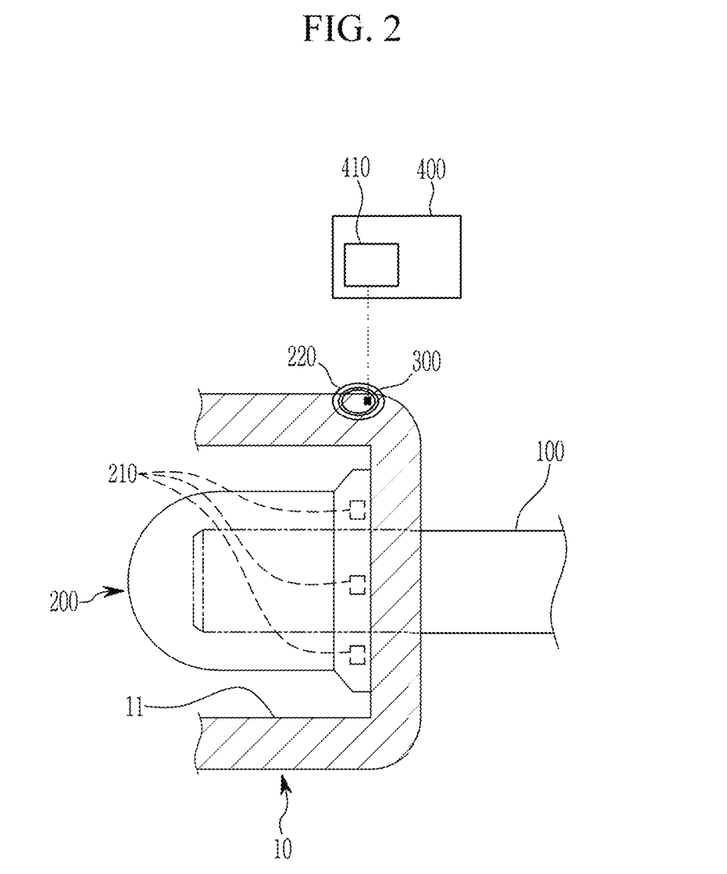
FIG. 2 is an enlarged view of the wheel nut loosening detection device according to an embodiment of the present disclosure.

FIG. 1 is a view illustrating a wheel nut loosening detection device according to an embodiment of the present disclosure. FIG. 2 is an enlarged view of the wheel nut loosening detection device according to an embodiment of the present disclosure.

Referring to FIGS. 1 and 2, the wheel nut loosening detection device, according to the embodiment of the present disclosure, includes: a wheel 10 including a wheel nut fastening unit 11; a wheel bolt 100 configured to penetrate the wheel 10 and a hub 20; and a wheel nut 200 fastened to the wheel bolt 100 and configured to fix the wheel 10 and the hub 20. The wheel nut 200 has at least one magnet 210. A closed circuit 220 is mounted in the wheel nut fastening unit 11 and is disposed adjacent to the at least one magnet 210. The wheel nut fastening unit 11 may be disposed at any position on the wheel 10 of the vehicle at which the wheel nut 200 and the wheel bolt 100 are fastened to each other.

For example, the closed circuit 220 may be a conductive wire made of copper or the like.

As described below, when the wheel nut 200 is loosened, the magnet 210 mounted on the wheel nut 200 moves together with the wheel nut 200. Therefore, a change in magnetic flux occurs on the closed circuit 220. The change in magnetic flux generates induced current in the closed circuit 220.

The wheel nut loosening detection device, according to an embodiment of the present disclosure, may include: a current detector 300 configured to output a corresponding signal in response to the change in current in the closed circuit 220; and an output unit 400 configured to output a current detection signal or a warning signal in response to an output signal of the current detector 300.

The current detector 300 and the closed circuit 220 may be electrically connected. The connection method is not particularly limited. The current detector 300 and the output unit 400 may communicate with each other. As an example, the current detector 300 and the output unit 400 may communicate with each other in a wireless manner (e.g., wirelessly).

The current detector 300 and the closed circuit 220 are electrically connected to each other. The current detector 300 is operated by the induced current when the induced current is generated in the closed circuit 220. Further, the current detector 300 may output a current amount signal of the corresponding induced current to the output unit 400.

The output unit 400 may be implemented by one or more microprocessors configured to be operated by a preset program. The preset program may include a series of commands for performing the method according to an embodiment of the present disclosure.

The wheel nut loosening detection device, according to an embodiment of the present disclosure, is not particularly limited by the method of outputting the current detection signal or the warning signal by the output unit 400. As an example, the output unit 400 may be disposed on an instrument panel in the vehicle and output the current detection signal or the warning signal in the form of an image. As another example, the output unit may output the current detection signal or the warning signal by turning on a light-emitting lamp when the output signal of the current detector 300 is implemented in the form of a light-emitting lamp (not illustrated). Therefore, a driver in the vehicle may recognize the loosened state of the wheel nut 200.

As an example, the output unit 400 may include a separate warning unit 410 configured to output a corresponding warning signal. As an example, the warning unit 410 may output the warning signal in the form of a warning sound or an image.

The wheel nut loosening detection device, according to an embodiment of the present disclosure, may further include a memory 420 configured to store an output value of the current detector 300 and/or the number of signal outputs of the current detector 300.

Figure 3:
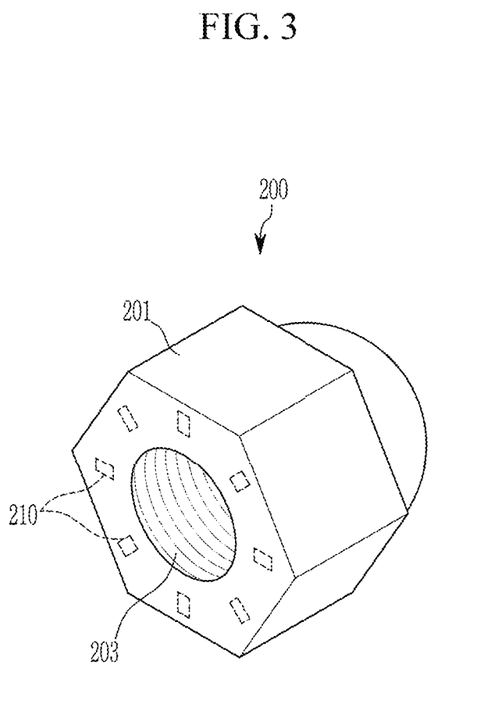
FIG. 3 is a perspective view of a wheel nut that may be applied to the wheel nut loosening detection device according to an embodiment of the present disclosure.
Figure 4:
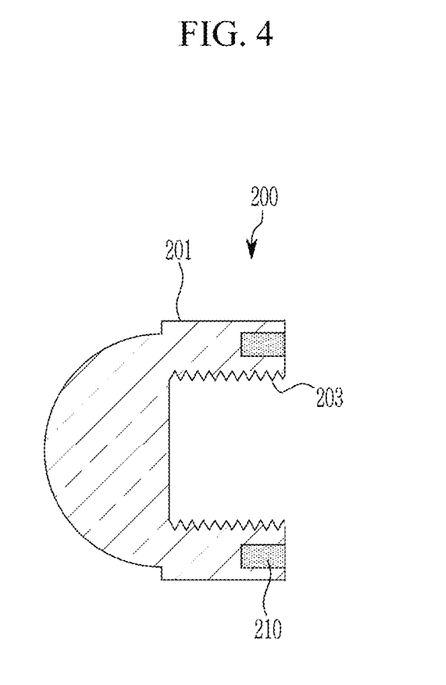
FIG. 4 is a cross-sectional view of the wheel nut that may be applied to the wheel nut loosening detection device according to an embodiment of the present disclosure.

FIG. 3 is a perspective view of a wheel nut that may be applied to the wheel nut loosening detection device according to an embodiment of the present disclosure. FIG. 4 is a cross-sectional view of the wheel nut that may be applied to the wheel nut loosening detection device according to an embodiment of the present disclosure.

Referring to FIGS. 3 and 4, in the wheel nut loosening detection device, according to an embodiment of the present disclosure, the at least one magnet 210 is inserted into the wheel nut 200. As an example, the at least one magnet 210 may be a plurality of magnets provided in the wheel nut 200. The plurality of magnets 210 may be disposed at predetermined intervals along a periphery of the wheel nut 200. Typically, the wheel nut 200 may have a hexagonal cross-sectional shape and be variously manufactured in accordance with the required torque and design. As an example, one side of the wheel nut 200 may be closed, but the present disclosure is not particularly limited to the configuration in which one side of the wheel nut 200 is closed.

As an example, the wheel nut 200 may include a nut body 201 configured to define an external shape of the wheel nut 200. A screw thread 203 may be formed in the nut body 201 and fastened to the wheel bolt 100.

The plurality of magnets 210 may be inserted into the nut body 201 and disposed at predetermined intervals along the periphery of the wheel nut 200.

In general, the wheel nut 200 and the wheel bolt 100 are kept fastened. However, the wheel nut 200 may be loosened by external factors or the vibration of the vehicle. Hereinafter, the process in which the induced current is generated in the closed circuit 220 is described in detail.

Figure 5:
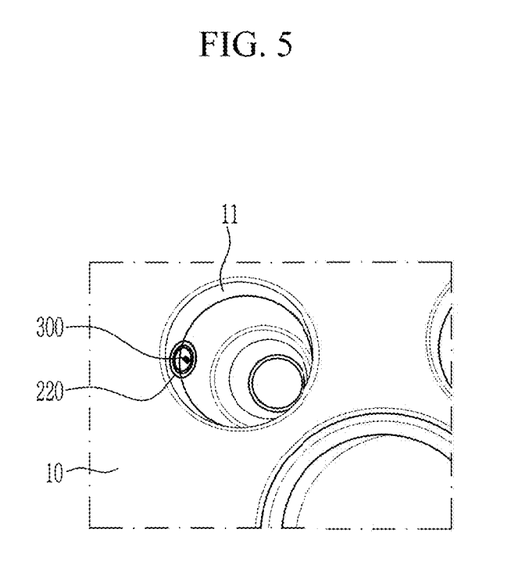
FIG. 5 is a partial perspective view illustrating a wheel nut fastening unit including a closed circuit and a current detector according to an embodiment of the present disclosure.
Figure 6:
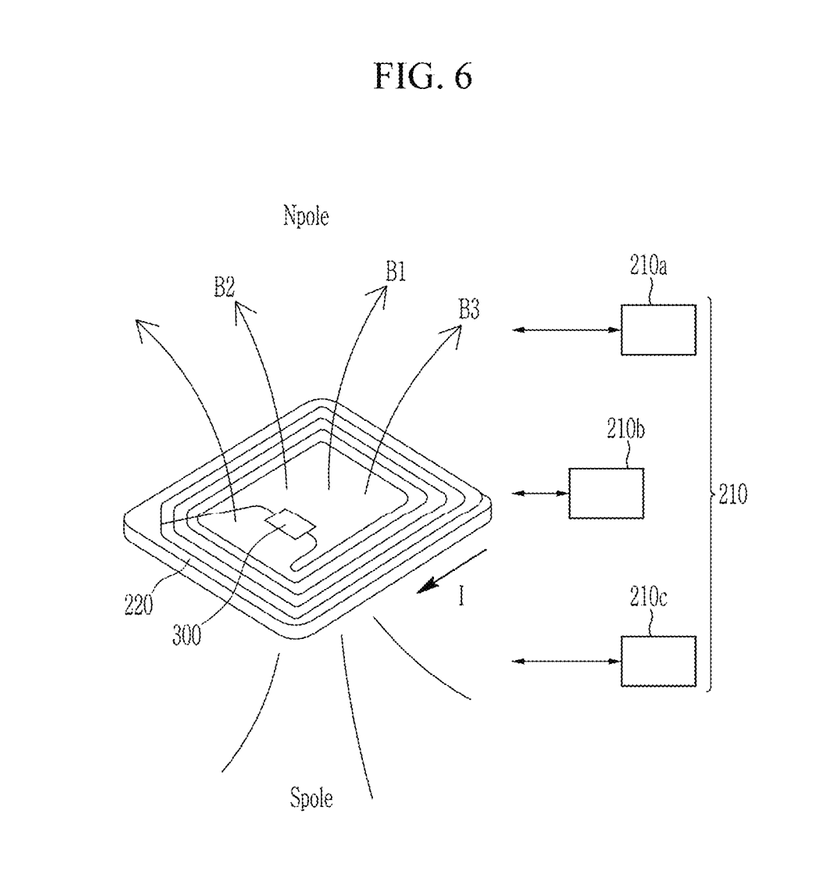
FIG. 6 is a view illustrating a process in which the wheel nut loosening detection device, according to an embodiment of the present disclosure, generates induced current.

FIG. 5 is a partial perspective view illustrating the wheel nut fastening unit, including the closed circuit 220 and the current detector 300, according to an embodiment of the present disclosure. FIG. 6 is a view illustrating a process in which the wheel nut loosening detection device, according to an embodiment of the present disclosure, generates induced current.

Referring to FIGS. 1-6, the closed circuit 220 may be mounted in the wheel nut fastening unit 11 disposed at any position on the wheel 10 at which the wheel nut 200 and the wheel bolt 100 are fastened to each other. As an example, the closed circuit 220 may be disposed on the wheel nut fastening unit 11 and mounted at the position at which the magnetic force of the magnet 210 is applied.

The wheel nut 200 may be loosened by external factors or vibrations of the vehicle, and a relative position between the closed circuit 220 and the magnet 210 mounted on the wheel nut 200 is changed by the loosened state of the wheel nut 200. More specifically, when a relative position of at least any one of the magnets 210, which apply the magnetic force to the closed circuit 220, is changed with respect to the position of the closed circuit 220, a change in magnetic flux occurs in the closed circuit 220. The change in magnetic flux generates the induced current in the closed circuit 220.

In other words, referring to FIG. 6, the change in the relative position of the magnet 210 (for example, at least any one of the plurality of magnets 210*a*, 210*b*, and 210*c*), changes the magnetic fields B1, B2, or B3. Therefore, the induced current (1) is generated in the closed circuit 220.

In other words, when the relative position of the magnet 210 is changed with respect to the position of the closed circuit 220 by the loosened state of the wheel nut 200, the induced current (1) is generated. Based on Fleming's right-hand rule, the induced current (1) flows in a direction in which the induced current (1) restricts an increase in magnetic flux in the closed circuit 220. As an example, based on FIG. 6, the induced current may flow clockwise on the closed circuit 220.

In other words, when the relative position of the magnet 210 with respect to the closed circuit 220 is changed by the loosened state of the wheel nut 200, the induced current (1) is generated. The induced current (1) flows in a direction in which the induced current (1) restricts a decrease in magnetic flux in the closed circuit 220.

As illustrated in FIG. 6, where the plurality of magnets 210*a*, 210*b*, and 210*c* is disposed at predetermined intervals in the wheel nut 200, the respective magnets 210 affect the change in the magnetic flux of the closed circuit 220 when the wheel nut 200 is loosened. For example, when the wheel nut 200 is loosened, any one of the magnets 210 may become distant from the closed circuit 220, but another magnet 210 may become closer to the closed circuit 220. A total change in magnetic flux may be determined collectively in consideration of the values of changes of the plurality of magnets 210.

Hereinafter, a method of controlling the wheel nut loosening detection device, according to an embodiment of the present disclosure, is described.

Figure 7:
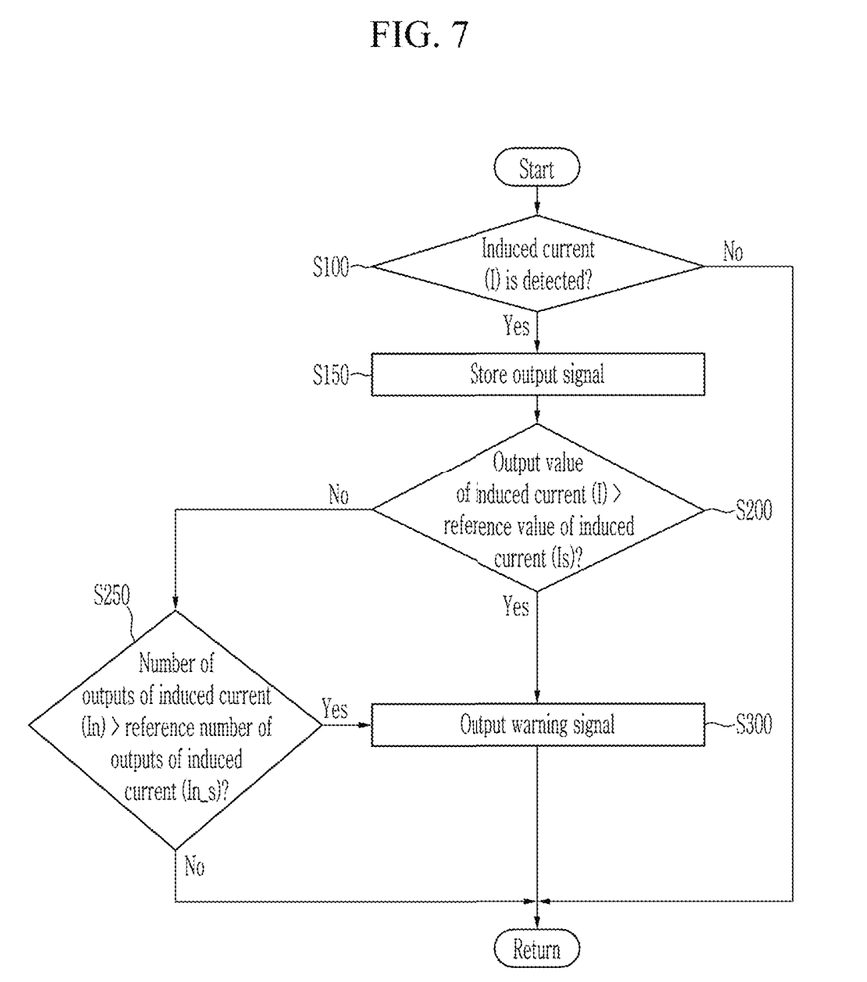
FIG. 7 is a flowchart illustrating a method of controlling the wheel nut loosening detection device according to an embodiment of the present disclosure.

FIG. 7 is a flowchart illustrating a method of controlling the wheel nut loosening detection device according to an embodiment of the present disclosure.

Referring to FIG. 7, first, a step S100 of detecting, by the current detector 300, the induced current in the closed circuit 220 is performed.

The wheel nut 200 may be loosened by external factors or vibrations of the vehicle while rotating relative to the wheel bolt 100. The single magnet 210 or the plurality of the magnets 210 mounted in the wheel nut 200 rotate. Therefore, the induced current (1) is generated in the closed circuit 220.

When the induced current (1) is generated in the closed circuit 220, the current detector 300 electrically connected to the closed circuit 220 outputs a signal corresponding to a current value of the induced current (1). In this case, the induced current (1) is operation energy (or electric power) for the current detector 300.

Based on the output signal of the current detector 300, the output unit 400 determines whether the induced current (1) is generated in the closed circuit 220. When the induced current (1) is detected by the current detector 300, the output unit 400 compares the output values of the induced current (1).

As an example, the output unit 400 may compare the output value (1) outputted by the current detector 300 with a preset reference value (Is) of the induced current (S200). The output unit 400 may output a warning signal to the driver when the output value (1) exceeds the preset reference value (Is) of the induced current (S300).

The reference value (Is) may be any one of a total amount of induced current (1) generated by the loosened state of the wheel nut 200, an average value of the generated induced current (1), and a total sum of absolute values of the generated induced current (1). However, the present disclosure is not particularly limited to the calculation method or type.

As an example, the reference value (Is) of the induced current may be a total amount of the induced current (1) generated when the wheel nut 200 is loosened by a preset limit rotation angle of the wheel nut 200, for example, 180 degrees or more. Therefore, the driver may indirectly recognize that the loosened state of the wheel nut 200 exceeds a predetermined level and may warn a user of this situation (S300).

When the current detector 300 outputs the signal, the memory 420 may store the outputted signal (S150).

The output unit 400 may compare the measured number of outputs (In) of the induced current (1) with a preset number of outputs (In_s) (S250). When the measured number of outputs (In) of the induced current (1) exceeds the preset number of outputs (In_s), the output unit 400 may output a warning signal (S300).

In other words, when the measured number of outputs (In) of the induced current (1), which are stored in the memory 420, exceeds the preset number of outputs (In_s), the output unit 400 may generate a warning signal indicating that the wheel nut 200 may be separated as the wheel nut 200 is repeatedly loosened.

The total amount of the induced current (1), the average value of the induced current (1), the total sum of the absolute values of the generated induced current (1), or the reference number (In_s) of outputs of the measured induced current (1), which is used to warn of the loosened state, may be determined in advance through experiments and stored in the memory 420.

According to the wheel nut loosening detection device, according to an embodiment of the present disclosure, the driver may recognize the generation of the induced current (1) and predict a loosened state of the wheel nut. The driver may recognize the loosened state of the wheel nut even while the vehicle travels. Therefore, it is possible to prevent a safety accident that may occur because of the loosened state of the wheel nut.

In addition, according to an embodiment of the present disclosure, the wheel nut loosening detection device may detect the loosened state of the wheel nut without using a separate battery. Therefore, it is possible to detect the loosened state of the wheel nut without using the electric power of the battery of the vehicle.

While this disclosure has been described in connection with what is presently considered practical embodiments, it is to be understood that the disclosure is not limited to the disclosed embodiments. On the contrary, it is intended to cover various modifications and equivalent arrangements included within the spirit and scope of the appended claims.

DESCRIPTION OF SYMBOLS

| | |
|---|---|
| 10: Wheel | 11: Wheel nut fastening unit |
| 20: Hub | 100: Wheel bolt |
| 200: Wheel nut | 201: Nut body |
| 203: Screw thread | 210: Magnet |
| 220: Closed circuit | 300: Current detector |
| 400: Output unit | 410: Warning unit |
| 420: Memory | |

What is claimed is:

1. A wheel nut loosening detection device comprising:
a wheel having a wheel nut fastening unit;
a hub;
a wheel bolt configured to penetrate the wheel and the hub;
a wheel nut fastened to the wheel bolt and configured to fix the wheel and the hub;
at least one magnet mounted on the wheel nut;
a closed circuit mounted in the wheel nut fastening unit and disposed adjacent to the at least one magnet;
a current detector configured to output a corresponding output signal in response to a change in current in the closed circuit; and
an output unit configured to output a warning signal in response to the output signal of the current detector, wherein:
the at least one magnet comprises a plurality of magnets, and
the plurality of magnets is disposed at predetermined intervals along a periphery of the wheel nut.

2. The wheel nut loosening detection device of claim 1, further comprising:
a memory configured to store an output value and a number of outputs in response to the output signal of the current detector.

3. The wheel nut loosening detection device of claim 2, wherein:
the output unit outputs a warning signal when a measured number of outputs of an induced current exceeds a preset number of outputs.

4. The wheel nut loosening detection device of claim 1, wherein:
the current detector and the output unit communicate with each other in a wireless manner.

5. The wheel nut loosening detection device of claim 1, wherein:
the current detector outputs a value related to a generation of an induced current in response to the induced current being induced by a rotation of the wheel nut.

6. The wheel nut loosening detection device of claim 5, wherein:
the output unit outputs a warning signal when a measured output value of the induced current exceeds a preset reference value.

7. A method of controlling the wheel nut loosening detection device according to claim 1, the method comprising:
detecting, by the current detector, an induced current in the closed circuit;

comparing, by the output unit, an output value outputted by the current detector with a preset reference value of the induced current when the current detector detects the induced current; and outputting, by the output unit, a warning signal when the output value exceeds the preset reference value of the induced current.

8. The method of claim 7, wherein:

the wheel nut loosening detection device further comprises a memory configured to store an output value and a number of outputs in response to the output signal of the current detector, and the method further comprises storing an outputted signal in the memory when the current detector outputs the output signal.

9. The method of claim 8, further comprising:

comparing, by the output unit, a measured number of outputs of the induced current with a preset number of outputs; and outputting, by the output unit, a warning signal when the measured number of outputs of the induced current exceeds the preset number of outputs.

10. A wheel nut loosening detection device comprising:

a wheel having a wheel nut fastening unit;

a hub;

a wheel bolt configured to penetrate the wheel and the hub;

a wheel nut fastened to the wheel bolt and configured to fix the wheel and the hub;

at least one magnet mounted on the wheel nut;

a closed circuit mounted in the wheel nut fastening unit and disposed adjacent to the at least one magnet;

a current detector configured to output a corresponding output signal in response to a change in current in the closed circuit; and an output unit configured to output a warning signal in response to the output signal of the current detector, wherein the current detector outputs a value related to a generation of an induced current in response to the induced current being induced by a rotation of the wheel nut.

11. The wheel nut loosening detection device of claim 10, wherein:

the output unit outputs a warning signal when a measured output value of the induced current exceeds a preset reference value.

* * * * *